(12) United States Patent
Yang

(10) Patent No.: US 8,395,223 B2
(45) Date of Patent: Mar. 12, 2013

(54) COAXIAL TRANSISTOR STRUCTURE

(76) Inventor: Chun-Chu Yang, Kaohsiung (TW)

( * ) Notice: Subject to any disclaimer, the term of this patent is extended or adjusted under 35 U.S.C. 154(b) by 2 days.

(21) Appl. No.: 13/214,784

(22) Filed: Aug. 22, 2011

(65) Prior Publication Data

US 2011/0303986 A1    Dec. 15, 2011

Related U.S. Application Data

(62) Division of application No. 12/255,721, filed on Oct. 22, 2008, now Pat. No. 8,030,714.

(30) Foreign Application Priority Data

Oct. 24, 2007    (TW) ............................... 96139774 A

(51) Int. Cl.
*H01L 27/105*    (2006.01)

(52) U.S. Cl. ................. 257/372; 257/E27.063

(58) Field of Classification Search .................. 257/372, 257/E27.063, E27.064
See application file for complete search history.

(56) References Cited

U.S. PATENT DOCUMENTS

| 4,143,392 | A  | 3/1979 | Mylroie |
| 6,525,383 | B1 | 2/2003 | Stecher |
| 2007/0096174 | A1 | 5/2007 | Higuchi |

*Primary Examiner* — W. Wendy Kuo

(74) *Attorney, Agent, or Firm* — Muncy, Geissler, Olds & Lowe, PLLC

(57) ABSTRACT

The present invention discloses a coaxial transistor formed on a substrate, particularly a coaxial metal-oxide-semiconductor field-effect transistor (CMOSFET). The chips or substrates of the CMOSFETs can be stacked up and connected via through-holes to form a coaxial complementary metal-oxide-semiconductor field-effect transistor (CCMOSFET), which is both full-symmetric and full-complementarily, has a higher integration and is free of the latch-up problem.

2 Claims, 7 Drawing Sheets and further smaller input current and thus becomes the most popular element in digital logic circuits. The electron mobility of the N-channel MOS (NMOS for short) is much greater than the hole mobility of the P-channel MOS (PMOS for short). Under the conditions of identical dopant concentrations and identical width-length ratios of the gates, NMOS

COAXIAL TRANSISTOR STRUCTURE

This application is a divisional application of U.S. application Ser. No. 12/255,721, filed on Oct. 22, 2008 now U.S. Pat. No. 8,030,714, the entirety of which is incorporated by reference herein.

FIELD OF THE INVENTION

The present invention relates to a coaxial transistor structure, particularly to high-integration coaxial MOSFETs and a full-symmetric coaxial complementary MOSFET formed of the coaxial MOSFETs.

BACKGROUND OF THE INVENTION

The term "transistor" is derived from "transfer-resistor", which means "varying resistor" or "adjustable resistor". In electronics, the transistor plays an unparalleled role. The bipolar junction transistor (BJT) varies the built-in resistor to regulate current. In digital logic electronics, the unipolar transistor maximizes the built-in resistor to turn off current or minimizes the built-in resistor to conduct current, such as JFET (Junction-Field-Effect-Transistor), MESFET (Metal-Semiconductor-Field-Effect-Transistor), and MOSFET (Metal-Oxide-Semiconductor-Field-Effect-Transistor). The ability, that control the adjustment of built-in resistor in transistor, is based on the forward bias or reverse bias that both arranged and selected initially of the built-in potential created by the PN junction within structures. In BJT consisting of an emitter, a base and a collector, the bias of the base controls the resistance value of the resistor. In FET consisting of a source (S), a gate(G) and a drain(D), the bias of the gate controls the conduction state of carriers (electrons or holes). In MOS developed afterward, a body(B) is added to FET to prevent from floating potential, and a four-electrode transistor is thus formed. The base or gate functions exactly like a faucet switching on/off water and regulating the flow rate of water.

In fabricating each electrode of the three-electrode or four-electrode transistor, a diffusion, deposition, ion-implanting or epitaxial process forms patterns of cuboids having width, length and depth. The junctions of the electrodes are parallel arranged top-down or from left to right. Thus, the configuration of transistor elements in IC appears like a mosaic pattern, as shown in FIG. 1A and FIG. 1B. FIG. 1A is a top view schematically showing a CMOS inverter, and FIG. 1B is a sectional view of the CMOS inverter shown in FIG. 1A.

In 1947, Shockley, Bardeen and Brattain of the Bell Laboratory invented the transistor, which is a point contact germanium junction transistor and was disclosed in a U.S. Pat. No. 2,569,347 "Circuit Element Utilizing Semiconductive Material" issued on Sep. 25, 1951. However, in early 1960s, the idea of integrating a plurality of transistors into a substrate to miniaturize the digital computer was regarded as an extremely ridiculous thought by the Bell Laboratory—the birthplace of transistors. From then on, microelectronics has advanced by leaps and bounds. From nowadays view, the "humor" of the Bell Laboratory seems to be the motive force of the researchers challenging the miss impossible.

The conventional BJT has advantages of fast response and high current density and extensively applies to analog circuits. In applications to the inverters of digital logic circuits, TTL (Transistor-Transistor Logic) circuits and ECL (Emitter-Coupled Logic) circuits, the conventional BJT is hard to parallel FET, which uses voltage of electric field to control the conduction state, in the integration. Limited by the electrode areas, the conventional BJT is harder to promote the integration. As BJT uses the base current to control the collector-emitter current, the base layer has to physically exist to function as the carrier exchange body no matter how thin it is. The gate of FET is moved to the upper space and uses voltage to control the conduction state of the source-drain current. Thus, FET outperforms BJT in IC integration. Among FETs, MOSFET (MOS for short) has further higher integration, further lower power consumption, further greater input impedance and further smaller input current and thus becomes the most popular element in digital logic circuits. The electron mobility of the N-channel MOS (NMOS for short) is much greater than the hole mobility of the P-channel MOS (PMOS for short). Under the conditions of identical dopant concentrations and identical width-length ratios of the gates, NMOS operates much faster than PMOS. After the appearance of the ion implant technology for a high N-type dopant concentration and a high-precision doping-profile control, NMOS has replaced PMOS.

Refer to FIG. 1A and FIG. 1B. A conventional PMOS 103 and a conventional NMOS 101 are cascaded to form a conventional CMOSFET (Complementary MOSFET, CMOS for short). Two gates of NMOS 101 and PMOS 103 are connected to form a signal input terminal 102 of the digital logic circuit. The cascaded drain and source is used as a signal output terminal 104. NMOS 101 and PMOS 103 are respectively connected to a high voltage level 105 $V_{DD}$ and a low voltage level 106 $V_{SS}$—dual-state logic signals. When the common gate inputs a high voltage or a low voltage, one channel of NMOS 101 and PMOS 103 turns on, and the other channel turns off. In other words, whether the input signal is of a high voltage or a low voltage determines the output terminal of the CMOS. Theoretically, CMOS has none static power consumption. Only in the transient moment that PMOS and NMOS exchange the conduction states and turn on simultaneously, CMOS has dynamic power consumption. Since 1980s, CMOS has be used as the low-power consumption and fast-operation transistor structure for digital logic circuits and contributed much to the electronic industry. The conventional CMOS is formed via cascading NMOS and PMOS. No matter whether CMOS has a single well structure or a double well structure, CMOS intrinsically has a parasitic PNPN thyristor structure, which may generate a latch-up effect and make CMOS temporarily or eternally lose the voltage control function or even cause abrupt current increase and circuit burnout.

Refer to FIG. 2A and FIG. 2B for a latch-up state of an N-well CMOS inverter. FIG. 2A is a sectional view of an N-well CMOS. FIG. 2B is a diagram of an equivalent circuit of the CMOS shown in FIG. 2A. Q⊥ denotes a vertical parasitic PNP bipolar transistor, which is formed of a P+ source, an N-type well and a P-type substrate of PMOS. Q∥ is a horizontal parasitic NPN bipolar transistor, which is formed of an N+ source, a P-type substrate and an N-type well of NMOS. The collector of the horizontal NPN is connected to the base of the vertical PNP via the N-type well. The collector of the vertical PNP is connected to the base of the horizontal NPN via the P-type substrate. Then, the P-type substrate functions as the base (of NPN), the collector (of PNP), and the connection medium between the NPN base and the PNP collector; the N-type well functions as the base (of PNP), the collector (of NPN), and the connection medium between the PNP base and the NPN collector. Thus, the P-type substrate and the N-type well (functions like a substrate) become the repeated both collectors and bases (using the same carrier source), which are the origin of the latch-up phenomenon. The thorough solution to exterminate the latch-up phenomenon is to separate the N-type well from the P-type substrate.

$R_W$ is the cascade resistor between the N-type well and the P+ source of PMOS and thus called the N-type well resistor. Rsub is the cascade resistor between the P-type substrate and the N+ drain of NMOS and is thus called the substrate resistor. At some instant, a voltage surge caused by turning on a power source, an ionization event or another transient state results in so high a current that flows through the NPN collector and causes the current flowing through the N-type well resistor to bias the base and emitter of the PNP bipolar transistor Q⊥, wherein the N-type well functions both the NPN collector and the PNP base and thus may have a conflict. If the bias is great enough to force the PNP collector to generate current, the current flowing through the substrate resistor Rsub will further bias the base and emitter of the NPN bipolar transistor Q∥. Then, Q∥ will amplify more current to the N-type well resistor $R_W$ and increase the bias of Q⊥. The repeated circulation generates a positive feedback, and the latch-up phenomenon will not stop unless the power source is removed.

The conventional approaches to avoid the latch-up phenomenon include: (1) increasing the distance between NMOS and PMOS, (2) increasing the dopant concentration of the base, (3) using an epitaxial layer in the substrate to increase the triggering bias voltage from the horizontal resistance, (4) shortening the distance between the contact of the source and the contact of the body (Butted Contact), (5) Trench Isolation, (6) using a guard ring to absorb the injected charges and prevent from the dual carrier operation, (7) using a SOI (Silicon On Insulation) technology, and (8) using a 3D stacked CMOS structure. The abovementioned approaches (1)-(6) can be interpreted as increasing $R_W$ and Rsub in FIG. 1B to prolong or avoid the advanced triggering of Q⊥ and further inhibit the triggering of Q∥. Though approaches (1)-(6) can improve the latch-up problem, they cannot thoroughly exterminate the latch-up phenomenon, especially when high integration is required. Further, they all reduce the circuit density (integration) and decrease the switching speed of the circuit. In approach (7), MOS is completely constructed on the insulation layer, and the thyristor structure is almost vanished and hard to generate coupling current. Approach (7) can indeed prevent from the latch-up phenomenon. However, PMOS and NMOS are arranged on a plane side-by-side, and the integration is thus hard to increase. In approach (8), a MOS is formed over another MOS, and an oxide layer interposes therebetween. Although approach (8) can successfully overcome the latch-up phenomenon, it still has to overcome the problems of aligning masks and forming silicon semiconductor crystals on an oxide layer in the fabrication of 3D CMOS.

In using the low power consumption CMOS, the increased integration results in a high element density and delays the switching speed, which is another problem needing attention in addition to the latch-up problem.

SUMMARY OF THE INVENTION

The primary objective of the present invention is to solve the latch-up problem of the conventional CMOS and increase the integration of CMOS. The present invention improves the conventional PMOS into a coaxial PMOS (CPMOS for short), improves the conventional NMOS into a coaxial NMOS (CNMOS for short), and then joins the CPMOS and the CNMOS top-to-top to form a full-symmetric coaxial complementary metal-oxide-semiconductor field-effect transistor, whereby the latch-up problem is completely solved, the integration is promoted, and the response speed are increased. The full-symmetric coaxial complementary metal-oxide-semiconductor field-effect transistor of the present invention is abbreviated into CCMOSFET or CCMOS. In CCMOS of the present invention, two axial conductors of the CPMOS and the CNMOS are vertically cascaded, and the gates thereof are used jointly. In CCMOS of the present invention, each of the CPMOS and the CNMOS is coaxially symmetric by itself, and the elements of the CPMOS and the CNMOS are fully complementarily symmetric to each other. Similarly to the conventional 3D stacked CMOS structure, the vertically-stacked complementary CCMOSFET structure of the present invention is completely exempted from the latch-up problem and has a higher integration and a higher response speed.

DETAILED DESCRIPTION OF THE PREFERRED EMBODIMENTS

Figure 1A:
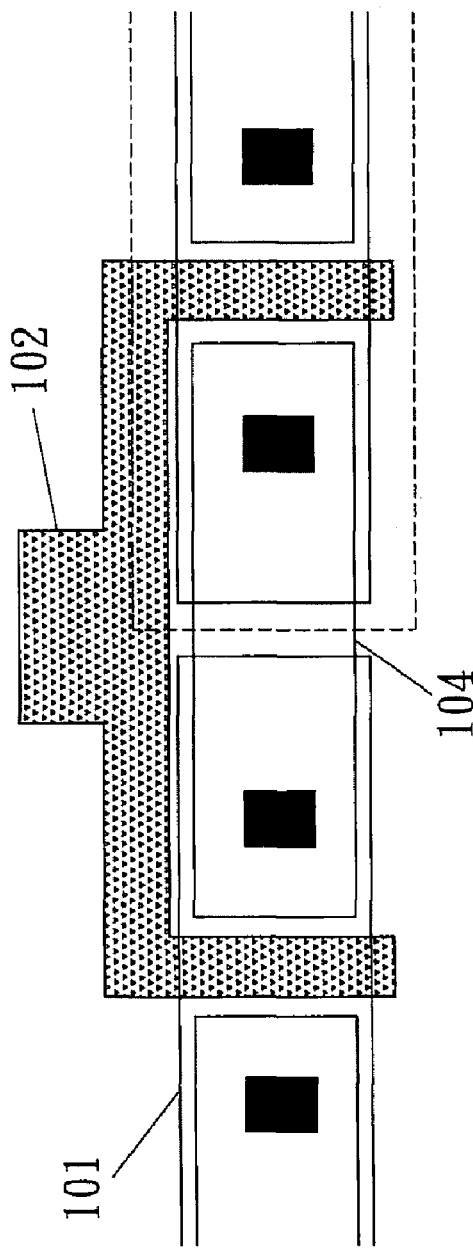
FIG. 1A is a top view schematically showing a conventional CMOS inverter.
Figure 1B:
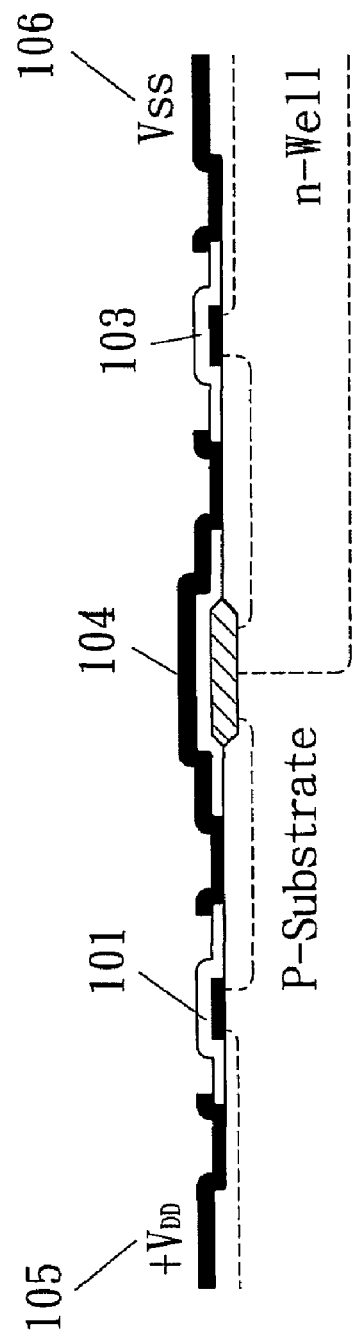
FIG. 1B is a sectional view of the CMOS inverter shown in FIG. 1A.
Figure 2A:
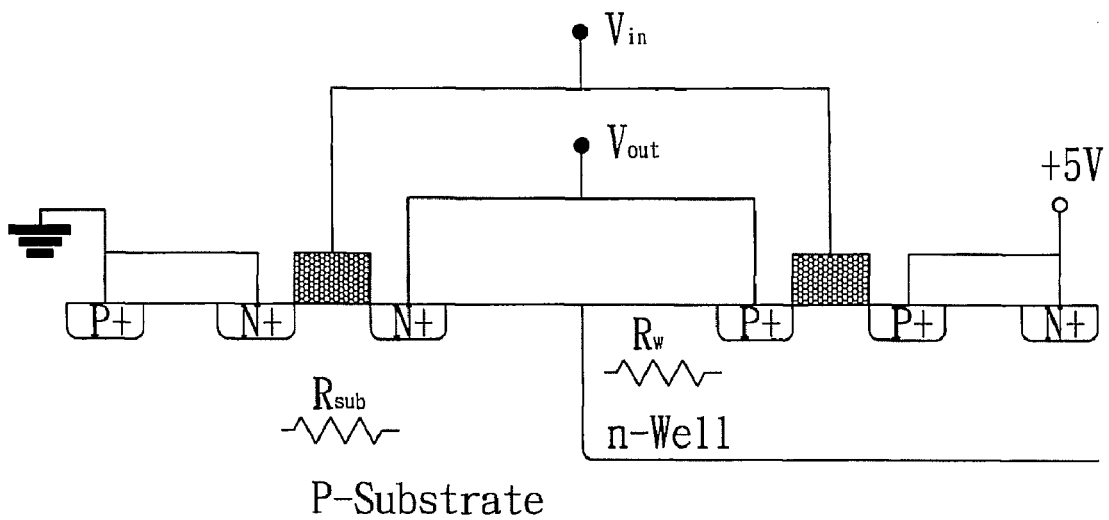
FIG. 2A is a sectional view schematically showing the latch-up state of a conventional CMOS inverter.
Figure 2B:
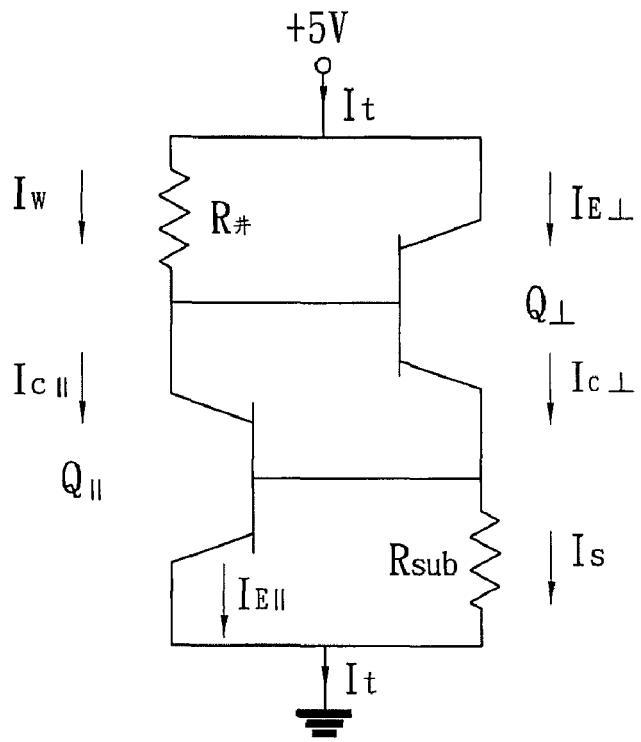
FIG. 2B is a diagram of an equivalent circuit of the conventional CMOS inverter shown in FIG. 2A.
Figure 3B:
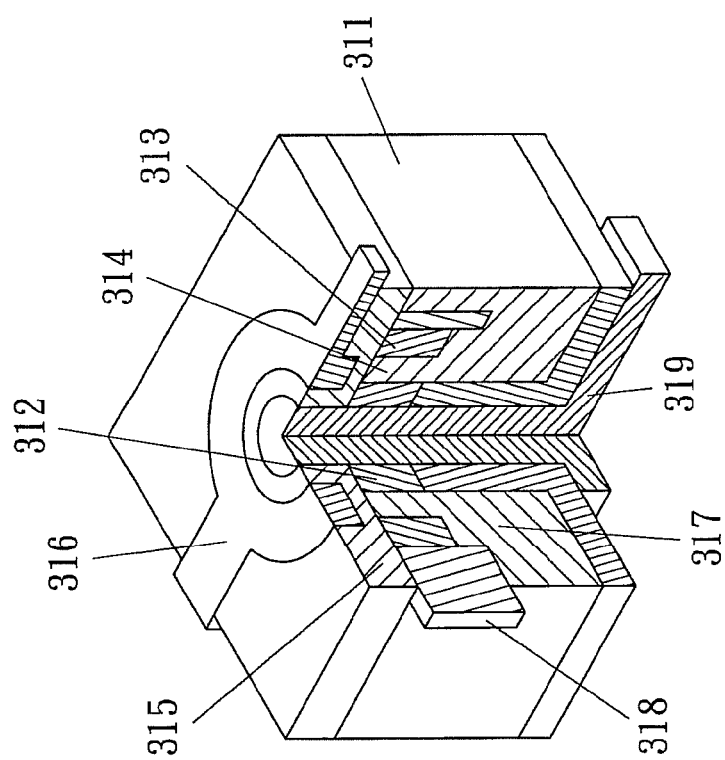
FIG. 3B is a perspective sectional view schematically showing a coaxial N-channel MOSFET according to the present invention.
Figure 3A:
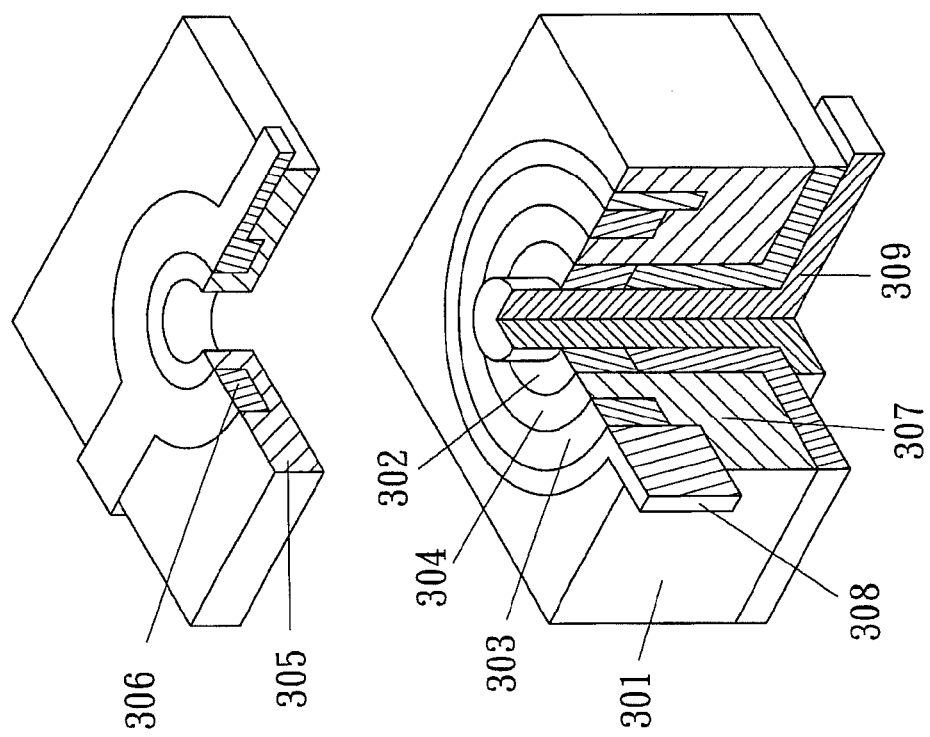
FIG. 3A is a perspective sectional view schematically showing a coaxial P-channel MOSFET according to the present invention.
Figure 4A:
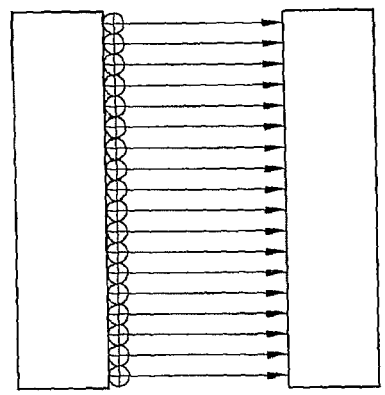
FIG. 4A is a top view schematically showing that current flows from a source to a drain in a conventional MOSFET.
Figure 4B:
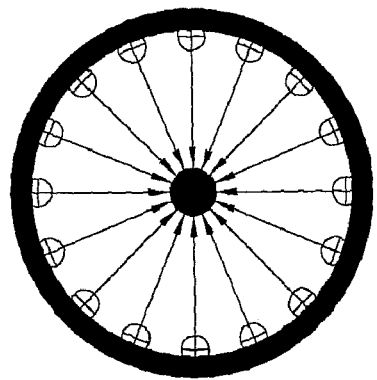
FIG. 4B is a diagram schematically showing that current converges to an axial conductor according to the present invention.

Refer to FIG. 3A, wherein an enhancement mode coaxial P-channel MOSFET is formed on an N-type substrate 301 or an N-type well is used to exemplify the present invention. The coaxial transistor structure comprises an annular P-type doped semiconductor drain area 302, an annular P-type doped semiconductor source area 303, an annular channel area 304 formed on the same substrate or well and arranged between the annular semiconductor drain area 302 and the annular semiconductor source area 303, an annular polysilicon or conductor gate 306 arranged over the annular channel area 304 and insulated by an oxide layer 305, a body 307 connected to the source and using the substrate or well as the reference potential, an external coaxial annular power supply conductor layer 308 connected to the body 307 and the annular source, and an inner axial conductor 309 connected to the semiconductor drain area where carriers concentrate. In the coaxial P-channel MOSFET, the annular elements and electrodes are fabricated into a coaxial structure. The annular gate 306 controls the direction of current. Refer to FIG. 4B. Different from the current flowing from the source to the drain in the conventional MOSFET shown in FIG. 4A, the current flows inward radially and uniformly from the external annular conductor layer 308 to the inner axial conductor 309 in the coaxial P-channel MOSFET of the present invention. Similarly to the conventional PMOS wherein the I/O direction may be varied, whether the current flows outward from the center or inward to the center is dependent on whether the source is arranged inside or outside. The Inventor had filed a Taiwan patent No. 095146963 "The Coaxial Light-Guide System Consisting Of Coaxial Light-Guide Fiber Basing Its Refractive Index Profiles On Radii And With Its Coaxial Both Semiconductor Light Sources And Semiconductor Detectors". Based on the principle of a coaxial semiconductor structure disclosed in the abovementioned patent, the present invention modifies the conventional PMOS into a coaxial CPMOS. The axially symmetric structure provides a uniform built-in electric field, which drives the drift current to radially and equidistantly fast flow, whereby the influence of the diffusion current is avoided, and the response speed is increased, and the noise is reduced. Under the electric field generated by two coaxial electrodes, the electrons or holes move along the shortest path, i.e. moves along the direction of the greatest radial electric field. Thus, the carriers can rapidly converge or diverge to form the greatest current.

Figure 4C:
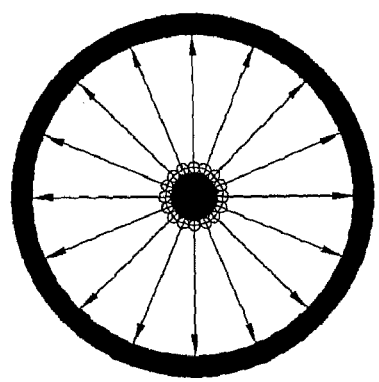
FIG. 4C is a diagram schematically showing that current diverges uniformly from an axial conductor according to the present invention.

Refer to FIG. 3B, wherein an enhancement mode coaxial N-channel MOSFET is formed on a P-type substrate 311 or a P-type well is used to exemplify the present invention. The coaxial transistor structure comprises an annular N-type doped semiconductor drain area 312, an annular N-type doped semiconductor source area 313, an annular channel area 314 formed on the same substrate or well and arranged between the annular semiconductor drain area 312 and the annular semiconductor source area 313, an annular polysilicon or conductor gate 316 arranged over the annular channel area 314 and insulated by an oxide layer 315, a body 317 connected to the source and using the substrate or well as the reference potential, an external coaxial annular power supply conductor layer 318 connected to the body 317 and the annular source, and an inner axial conductor 319 connected to the semiconductor drain area where carriers concentrate. In the coaxial N-channel MOSFET, the annular elements and electrodes are fabricated into a coaxial structure. The annular gate 316 controls the direction of current. Refer to FIG. 4C. Different from the current flowing from the source to the drain in the conventional MOSFET shown in FIG. 4A, the current flows outward radially and uniformly from the inner axial conductor 319 to the external annular conductor layer 318 in the coaxial N-channel MOSFET of the present invention. Similarly to the conventional NMOS wherein the I/O direction may be varied, whether the current flows outward from the center or inward to the center is dependent on whether the source is arranged inside or outside. The Inventor had filed a Taiwan patent No. 095146963 "The Coaxial Light-Guide System Consisting Of Coaxial Light-Guide Fiber Basing Its Refractive Index Profiles On Radii And With Its Coaxial Both Semiconductor Light Sources And Semiconductor Detectors". Based on the principle of a coaxial semiconductor structure disclosed in the abovementioned patent, the present invention modifies the conventional NMOS into a coaxial CNMOS. The axially symmetric structure provides a uniform built-in electric field, which drives the drift current to radially and equidistantly fast flow, whereby the influence of the diffusion current is avoided, and the response speed is increased, and the noise is reduced. Under the electric field generated by the two coaxial electrodes, the electrons or holes move along the shortest path, i.e. moves along the direction of the greatest radial electric field. Thus, the carriers can rapidly converge or diverge to form the greatest current.

Figure 5:
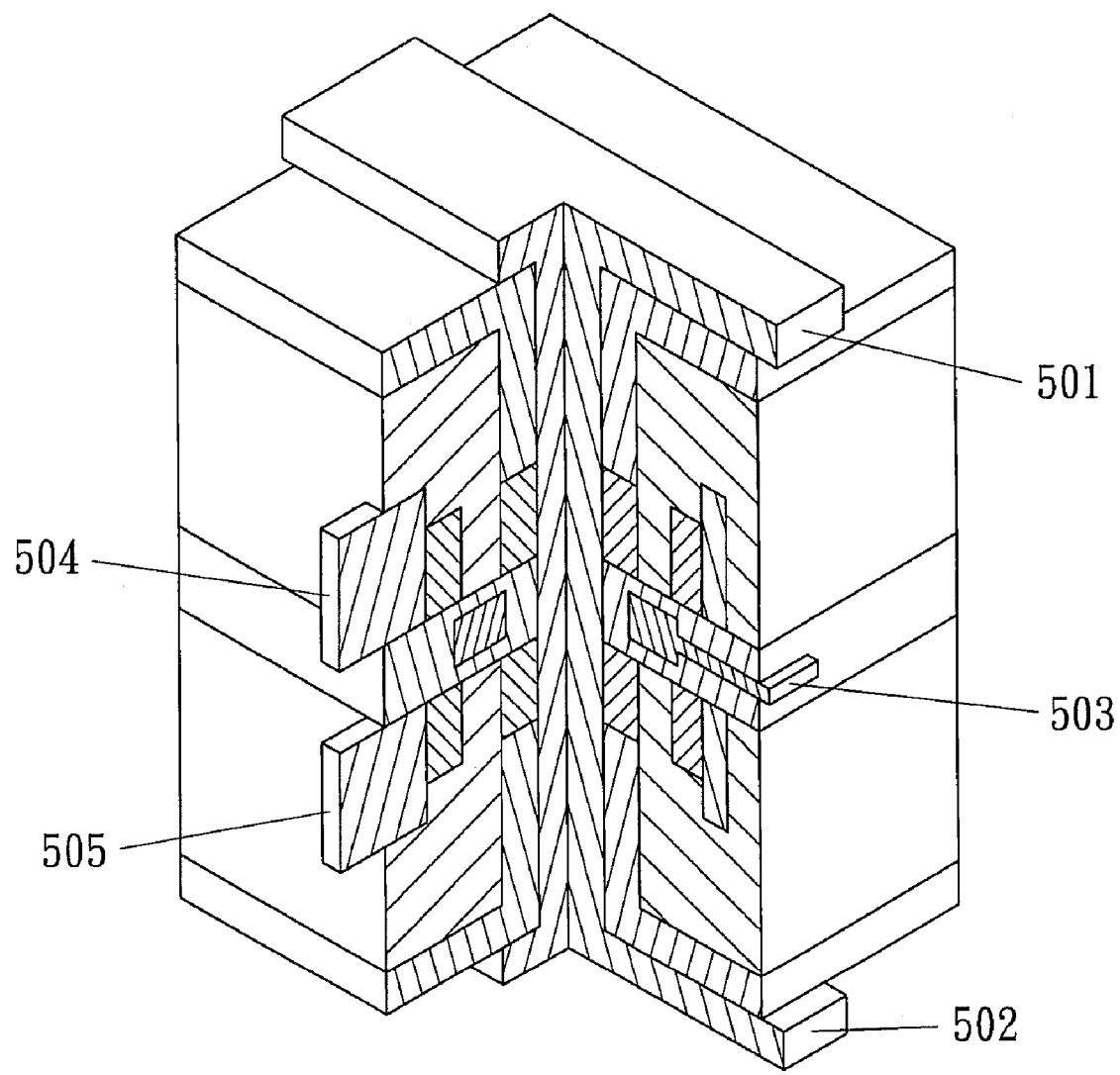
FIG. 5 is a perspective sectional view schematically showing a coaxial complementary MOSFET (CCMOSFET) according to the present invention.
Figure 6:
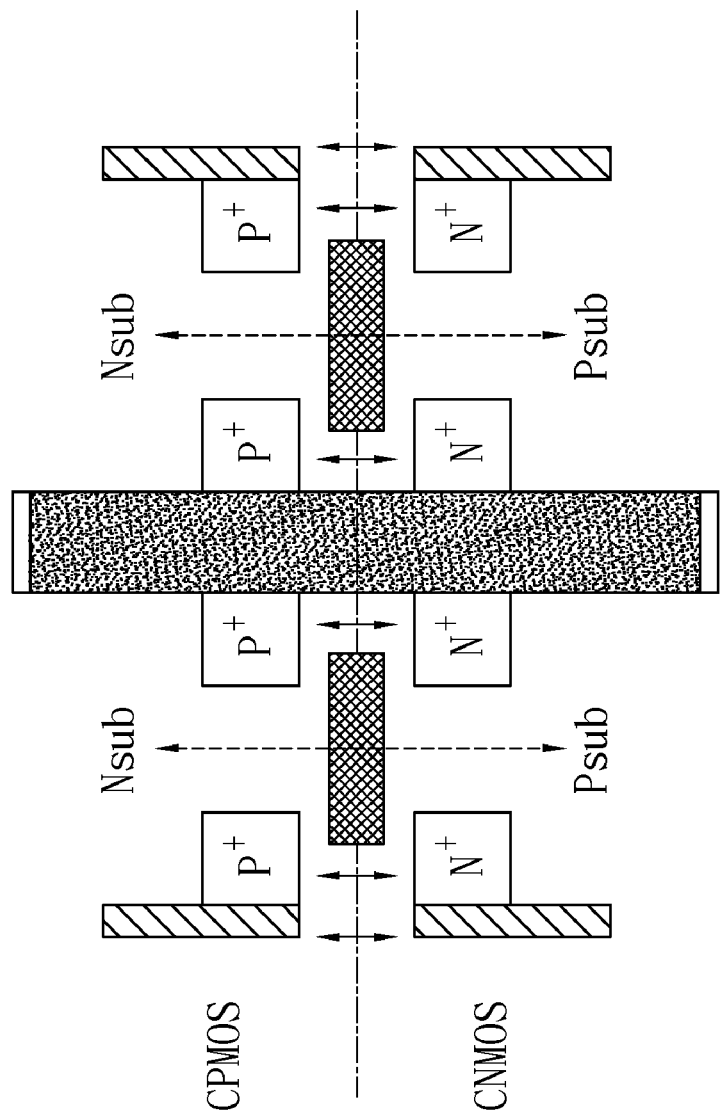
FIG. 6 is a sectional view schematically showing a full complementarily-symmetric CCMOSFET according to the present invention.

Refer to FIG. 5, wherein the CPMOS shown in FIG. 3A is flipped over to join with the CNMOS shown in FIG. 3B to form a full-symmetric coaxial CMOS (CCMOS). The axial conductor 309 and the axial conductor 319 are vertically connected to form an upper output terminal 501 and a lower output terminal 502. The gates thereof jointly form an input voltage control terminal 503, wherein 504 is a high voltage level $V_{DD}$, and 505 is a low voltage level $V_{SS}$. Refer to FIG. 6. In the CCMOS of the present invention, the two axial conductors are vertically cascaded, and the gates are used jointly. Each of the upper and lower semiconductor devices is coaxially symmetric by itself; the upper and lower semiconductor devices are completely complementarily symmetric to each other. The elements of the PNP transistor of the upper CPMOS are completely separated from the elements of the NPN transistor of the lower CNMOS; therefore, the latch-up problem is thoroughly solved. Different from the conventional CMOS structure wherein elements are arranged side-by-side, the CCMOS of the present invention has a vertically-stacked structure and thus has a higher integration. In the coaxial transistor structure of the present invention, the built-in electric field created by the PN junction is a uniform axially-symmetric electric field. The carriers flow equidistantly radially to converge inward or diverge outward, whereby a higher response speed is attained, and noise is reduced.

The present invention modifies the conventional PMOS into CPMOS, the conventional NMOS into CNMOS, and then joins the CPMOS and CNMOS top-to-top to form a full-symmetric CCMOS, whereby the latch-up problem is thoroughly solved, and whereby the integration and response speed are increased. The coaxialized MOSFET also realizes the function of a transistor—"varying resistor", "adjustable resistor" "maximizes the built-in resistor to turn off current or minimizes the built-in resistor to conduct current". The present invention is a perfect presentation of microelectronics, wherein the radial current converges or diverges equidistantly so smooth to save energy and so fitness for the nature just like blossom up and blossom down.

Below, an embodiment is used to further demonstrate the present invention.

Figure 7:
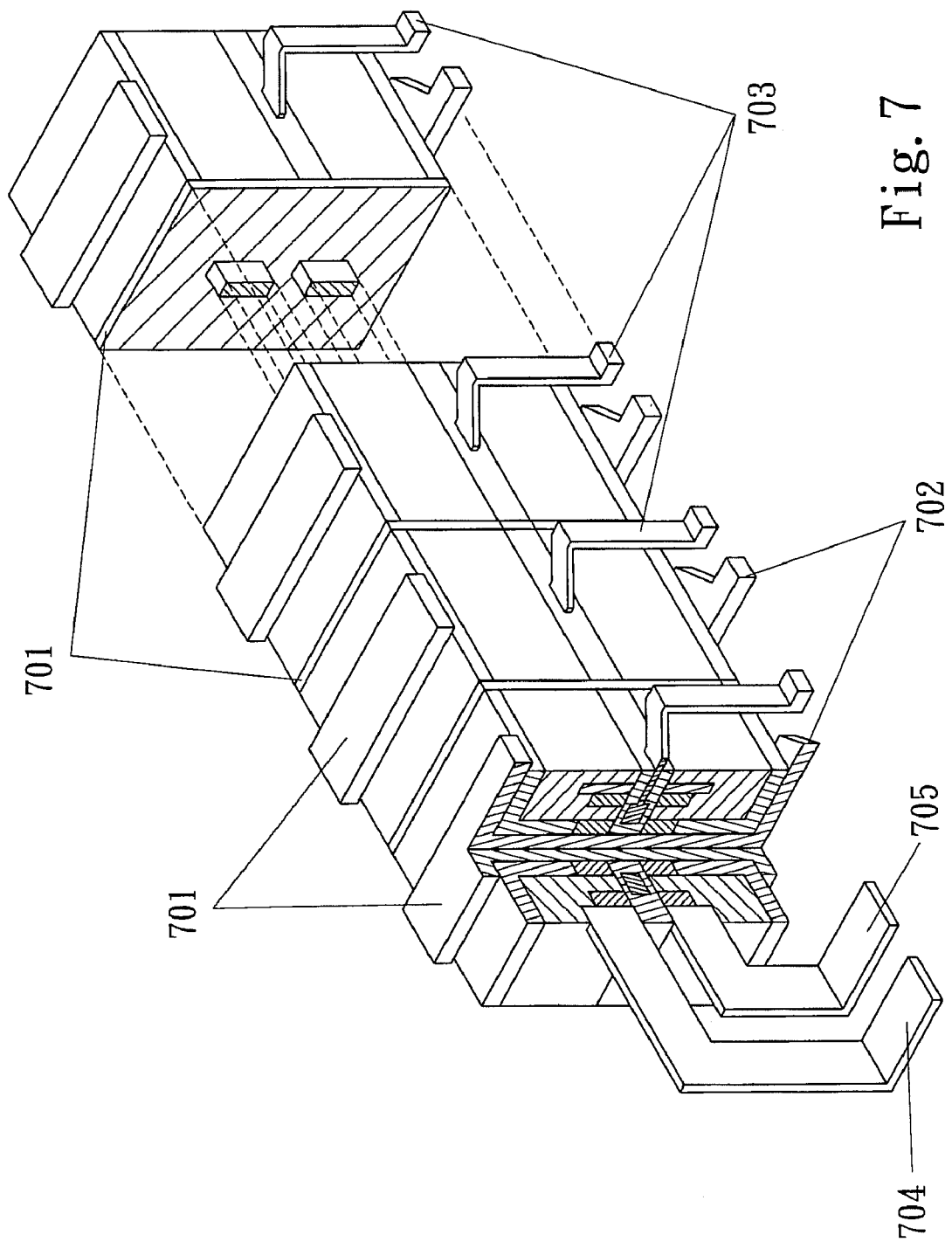
FIG. 7 is a diagram schematically showing a CCMOSFET inverter according to the present invention.

Refer to FIG. 7 for an inverter formed of CCMOSFET. The inverter is realized via top-to-top joining the CPMOS shown in FIG. 3A and the CNMOS shown in FIG. 3B. The axial conductor 309 and the axial conductor 319 are vertically connected to form an upper output terminal 701 and a lower output terminal 702. The gates thereof jointly form an input voltage control terminal 703. In each CCMOSFET, the two axial conductors 309 and 319 are vertically cascaded, and the gates are used jointly. Each of the upper and lower semiconductor devices is coaxially symmetric by itself; the upper and lower semiconductor devices are completely complementarily symmetric to each other. The inverters are separated by separating layers 706. When a low voltage level is input to the input voltage control terminal 703, the low voltage level of the common gate causes the P-channel of CPMOS thereabove to conduct current. The positive-hole carrier source of the source 704 supplies electricity at a high voltage $V_{DD}$, and the holes radially converge to the cascaded axial conductors; then the upper output terminal 701 and lower output terminal 702 output a high voltage level. In other words, the original low voltage level is pulled up to be a high voltage level. When a high voltage level is input to the input voltage control terminal 703, the high voltage level of the common gate causes the N-channel of CNMOS therebelow to conduct current. The electron carrier source of the source 705 supplies electricity at a negative voltage $V_{SS}$, and the electrons radially converge to the cascaded axial conductors; then the upper output terminal 701 and the lower output terminal 702 output a low voltage level. In other words, the original high voltage level is pulled down to be a low voltage level. If the low voltage level $V_{SS}$ is grounded, $V_{SS}$ is regarded as the ground voltage. If the input voltages are dual-state logic signals, the ground voltage is a negative voltage level. Thus is realized the function of an inverter. The coaxialized and vertically-stacked structure can promote the integration of the integrated circuit. Further, the coaxial transistor has a uniform electric field to drive current to fast converge or diverge by nature, whereby the power consumption is saved.

The figures and the elements denoted by numerals used in the abovementioned embodiments are only to schematically exemplify the present invention but not to cover all the characteristics of the present invention. Further, the elements in the figures are based on the spirit of the present invention but not drawn according to the physical proportion and number thereof. Therefore, the scope of the present invention is not limited by the figures.

The CMOSFET, CCMOSFET and the CCMOSFET inverter described above are only the embodiments to exemplify the present invention but not to limit the scope of the present invention. Therefore, any equivalent embodiment or application according to the spirit of the present invention is to be also included within the scope of the present invention.

The CMOSFET and the CCMOSFET inverter of the present invention not only have a high integration and a high response speed but also are thoroughly exempted from the latch-up problem. The present invention applies to various digital logic ICs and various high-speed mass memories, such as coaxial SRAM, coaxial DRAM, and coaxial ROM, or even coaxial DHBT (Double Heterojunction Bipolar Transistor). The coaxial transistor of the present invention can be fabricated with a lower cost and operates more power-efficiently.

The abovementioned coaxial transistor devices of the present invention can be singly used to control the conduction state, multi-used or jointly stacked and applied to various logic circuits, wherefore the present invention will contribute much to the electronic industry.

The present invention has been fully disclosed above, which is sufficient to enable the persons skilled in the art to understand, make, and use the present invention. However, it is not intended to limit the scope of the present invention. Any equivalent modification or variation is to be also included within the scope of the present invention, which is based on the claims stated below.

What is claimed is:

1. A coaxial complementary metal-oxide-semiconductor field-effect transistor (CCMOSFET) structure, which is formed via top-to-top joining a coaxial P-channel metal-oxide-semiconductor field-effect transistor (CPMOSFET) and a coaxial N-channel metal-oxide-semiconductor field-effect transistor (CNMOSFET) and, which is characterized in
that two axial conductors are cascaded vertically, and a gate of the CPMOSFET and a gate of the CNMOSFET are used jointly, and that each of said CPMOSFET and said CNMOSFET is coaxially symmetric by itself, and that elements of said CPMOSFET and said CNMOSFET are fully complementarily symmetric to each other.

2. The coaxial complementary metal-oxide-semiconductor field-effect transistor structure according to claim 1, which forms an inverter and further comprises a common gate functioning as an input control terminal of said inverter, and leads connected to said two axial conductors and functioning as an upper output terminal and a lower output terminal, and which is characterized in
that when a low voltage level is input to said input control terminal, a low voltage level of said common gate causes a P-channel of said CPMOSFET to conduct current, and a positive-hole carrier source of a source supplies electricity at a high voltage, and holes radially converges to said cascaded axial conductors to output a high voltage level, and
that when a high voltage level is input to said input voltage control terminal, a high voltage level of said common gate causes an N-channel of said CNMOSFET to conduct current, and an electron carrier source of a source supplies electricity at a negative voltage, and electrons radially converge to said cascaded axial conductors to output a low voltage level.

\* \* \* \* \*